United States Patent
Rajan et al.

(10) Patent No.: US 7,948,011 B2
(45) Date of Patent: May 24, 2011

(54) N-POLAR ALUMINUM GALLIUM NITRIDE/GALLIUM NITRIDE ENHANCEMENT-MODE FIELD EFFECT TRANSISTOR

(75) Inventors: Siddharth Rajan, Goleta, CA (US); Chang Soo Suh, Goleta, CA (US); James S. Speck, Goleta, CA (US); Umesh K. Mishra, Santa Barbara, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 11/523,286

(22) Filed: Sep. 18, 2006

(65) Prior Publication Data

US 2010/0264461 A1    Oct. 21, 2010

Related U.S. Application Data

(60) Provisional application No. 60/717,996, filed on Sep. 16, 2005.

(51) Int. Cl.
*H01L 29/66* (2006.01)
(52) U.S. Cl. .............................. 257/194; 257/E29.249
(58) Field of Classification Search .................. 257/194, 257/E29.249
See application file for complete search history.

(56) References Cited

U.S. PATENT DOCUMENTS

| | | | |
|---|---|---|---|
| 5,290,393 A * | 3/1994 | Nakamura | 438/509 |
| 6,064,082 A | 5/2000 | Kawai et al. | |
| 6,133,593 A | 10/2000 | Boos et al. | |
| 6,624,452 B2 * | 9/2003 | Yu et al. | 257/194 |
| 6,649,287 B2 * | 11/2003 | Weeks et al. | 428/698 |
| 2001/0015437 A1 | 8/2001 | Ishii et al. | |
| 2001/0020700 A1 | 9/2001 | Inoue et al. | |
| 2003/0006407 A1 * | 1/2003 | Taylor | 257/12 |
| 2004/0099888 A1 * | 5/2004 | Sriram | 257/288 |
| 2005/0051796 A1 * | 3/2005 | Parikh et al. | 257/192 |

OTHER PUBLICATIONS

PCT/US2006/36377 International Search Report dated May 15, 2008 (Pat. No. 6,046,082 which was listed in the Search Report had transposed numbers per PCT Officer Lynne Gurley. Should be Pat. No. 6,064,082).
Supplementary European Search Report, Application No. EP 06 85 1277, dated May 14, 2009.
Chini et al., "Fabrication and characterization of n-face AlGaN/GaN/AlGan HEMTs," Device Research Conference Digest, IEEE, Jun. 20, 2005, vol. 1, pp. 63-64.
Morkoc et al., "Polarization effects in nitride semiconductor device structures and performance of modulation doped field effect transistors," Solid State Electronics, Oct. 1, 1999, vol. 43, No. 10, pp. 1909-1927.
Zandler et al., "Pyroelectronics: novel device concepts based on nitride interfaces," Journal of Vacuum Science & Technology B, Jul. 1, 1999, vol. 17, No. 4, pp. 1617-1621.
Supplementary European Search Report, Application No. EP 07838270, dated Jun. 22, 2010.
Burnham, S. et al., "Mg doped GaN using a valved, thermally energetic source: enhanced incorporation, and control," Journal of Crystal Growth 279 (2005) 26-30.

(Continued)

*Primary Examiner* — Bradley K Smith
(74) *Attorney, Agent, or Firm* — Gates & Cooper LLP

(57) ABSTRACT

A novel enhancement mode field effect transistor (FET), such as a High Electron Mobility Transistors (HEMT), has an N-polar surface uses polarization fields to reduce the electron population under the gate in the N-polar orientation, has improved dispersion suppression, and low gate leakage.

37 Claims, 6 Drawing Sheets

OTHER PUBLICATIONS

Lebedev, V. et al., "Hexagonal AlN films grown on nominal and off-axis Si(0 0 1) substrates," Journal of Crystal Growth 230 (2001) 426-431.

Mita, S. et al., "Polarity control of GaN films grown by metal organic chemical vapor deposition on (0001) sapphire substrates," Mater. Res. Soc. Symp. Proc., vol. 831, 2005, pp. E3.20.1-E3.20.6.

Rajan, S. et al., "Growth and electrical characterization of N-face AlGaN/GaN heterostructures," Japanese Journal of Applied Physics, vol. 44, No. 49, 2005, pp. L1478-L1480.

Shen, X. et al., "Electrical properties of AlGaN/GaN heterostructures grown on vicinal sapphire (0001) substrates by molecular beam epitaxy," Applied Physics Letters 89, 2006, pp. 171906-1-171906-3.

Yamaguchi, K. et al., "Influence of AlN growth conditions on the polarity of GaN grown on AlN/Si(111) by metalorganic molecular beam epitaxy," Japanese Journal of Applied Physics, vol. 43, No. 2A, 2004, pp. L151-L153.

Zauner, A. et al., "Homo-epitaxial growth on misoriented GaN substrates by MOCVD," Mat. Res. Soc. Symp., vol. 595, 2000, pp. W6.3.1-W6.3.6.

* cited by examiner

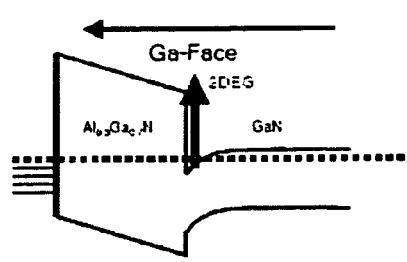
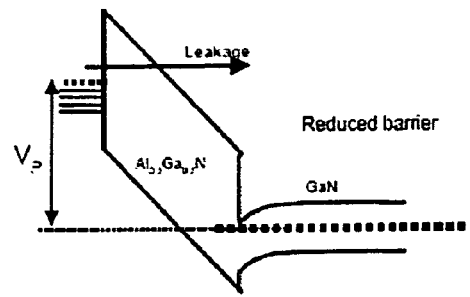
FIG. 5A  FIG. 5B
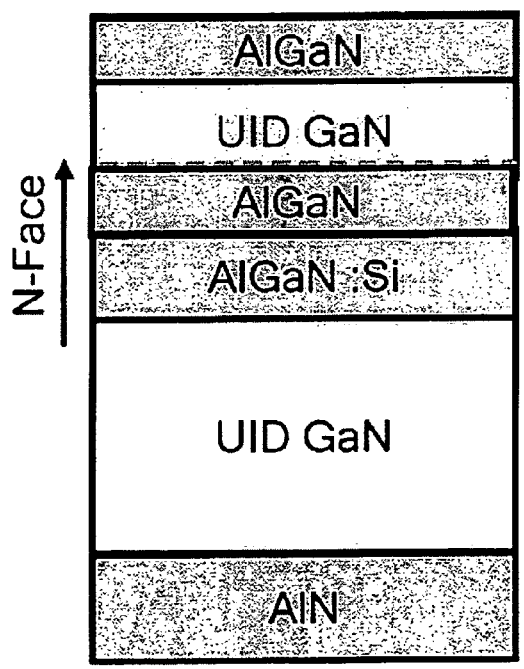
FIG. 6

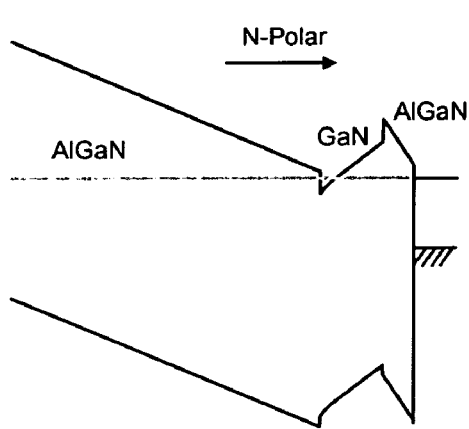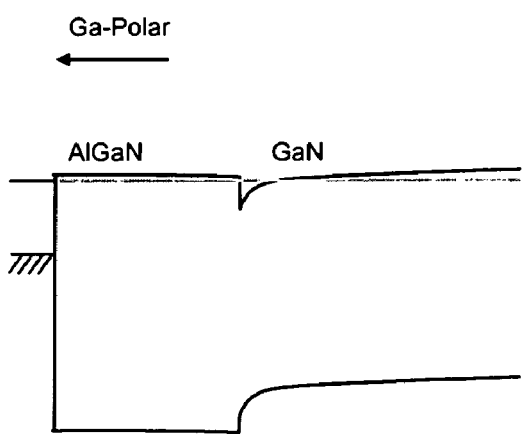
FIG. 9A                    FIG. 9B

N-POLAR ALUMINUM GALLIUM NITRIDE/GALLIUM NITRIDE ENHANCEMENT-MODE FIELD EFFECT TRANSISTOR

CROSS-REFERENCE TO RELATED APPLICATION

This application claims the benefit under 35 U.S.C. Section 119(e) of the following co-pending and commonly-assigned U.S. patent application:

U.S. Provisional Application Ser. No. 60/717,996, filed on Sep. 16, 2005, by Siddharth Rajan, Chang Soo Suh, James S. Speck, and Umesh K. Mishra, entitled "N-POLAR ALUMINUM GALLIUM NITRIDE/GALLIUM NITRIDE ENHANCEMENT-MODE FIELD EFFECT TRANSISTOR,";

which application is incorporated by reference herein.

STATEMENT REGARDING FEDERALLY SPONSORED RESEARCH AND DEVELOPMENT

This invention was made with Government support under Grant No. F49620-03-1-0235 awarded by AFOSR, and Grant No. H94003-04-2-0403 awarded by DARPA CNID. The Government has certain rights in this invention.

BACKGROUND OF THE INVENTION

1. Field of the Invention

The invention is related to N-polar aluminum gallium nitride (AlGaN)/gallium nitride (GaN) enhancement mode field effect transistors (FETs), such as High Electron Mobility Transistors (HEMTs).

2. Description of the Related Art

Group III-nitride based high electron mobility transistors (HEMTs) are attracting significant interest for power switching applications owing to the possibility of delivering high breakdown voltages ($V_{BD}$) and low on-resistance ($R_{ON}$) beyond the material limits of Si and SiC.

Enhancement mode (E-mode) or normally-off devices based on GaN technology are interesting for a variety of applications, and are especially desirable for power switching applications due to the added safety of a normally off device.

In devices grown in the Ga-polar or (0001) direction, E-mode operation is achieved in AlGaN/GaN buffer structures by etching away some of the AlGaN under the gate region (method-1), exposing the AlGaN under the gate region with a fluorine-based plasma (method-2), or by capping the AlGaN layer with a p-type GaN under the gate (method-3).

Threshold uniformity is especially important in large periphery high breakdown devices. Since AlGaN (and GaN) are most easily etched via dry etching (method-1), achieving uniform threshold voltage and repeatability is extremely difficult, and thus this method will remain unattractive without an etch-stop layer. Fluorine-plasma treatment (method-2) achieves threshold-voltage shift by a combination of implantation of negatively charged fluorine ions and etching of the AlGaN barrier, but this method also suffers from threshold voltage uniformity and repeatability problems. Although method-3 avoids the problem of etching the AlGaN below the gate, growing high-quality and uniform p-type material in the group-III nitride system is extremely difficult, and p-GaN/AlGaN interface trap-related dispersion provides another drawback to this approach.

In addition, GaN devices have been shown to be promising for high frequency applications. Since unpassivated GaN HEMTs have been shown to be dispersive under high speed switching, it is important to engineer these devices to suppress dispersion and therefore optimize the device performance at microwave frequencies.

Moreover, it is important to have GaN devices with structures that reduce gate leakage and therefore increase the breakdown voltage of the device. The reduction in gate leakage will also increase the reliability of these devices.

What is needed, then, are device structures that do not have these drawbacks and can provide these advantages.

The present invention proposes a device structure in the opposite N-polar or (000-1) direction has several advantages over the devices grown in the Ga-polar direction. For example, the proposed device structure in the opposite N-polar direction provides E-mode devices without using a gate recess etch. Threshold voltage is these devices will be controlled by the epitaxial-structure and will not be affected by the processing steps. Furthermore, since the polarization fields are used to deplete the 2-dimensional electron gas (2DEG), p-type doping is not necessary.

SUMMARY OF THE INVENTION

The present invention discloses a novel enhancement mode field effect transistor (FET), such as a High Electron Mobility Transistors (HEMT), has an N-polar surface uses polarization fields to reduce the electron population under the gate in the N-polar orientation, has improved dispersion suppression, and low gate leakage.

BRIEF DESCRIPTION OF THE DRAWINGS

Referring now to the drawings in which like reference numbers represent corresponding parts throughout:

FIGS. 5A and 5B show a device grown in the Ga-face orientation, wherein the gate is on the left side of the structure.

FIG. 6 illustrates the general structure of the N-face device for low gate leakage, wherein the top AlGaN layer may be replaced by an aluminum nitride (AlN) layer.

FIG. 8 illustrates that an insulator may be inserted beneath the gate for reduction of gate leakage and improving gate turn-on.

FIGS. 9A and 9B illustrate N-polar and Ga-polar devices under forward bias, showing that an effective barrier exists in the N-polar face, leading to higher turn-on.

DETAILED DESCRIPTION OF THE INVENTION

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Overview

Figure 1:
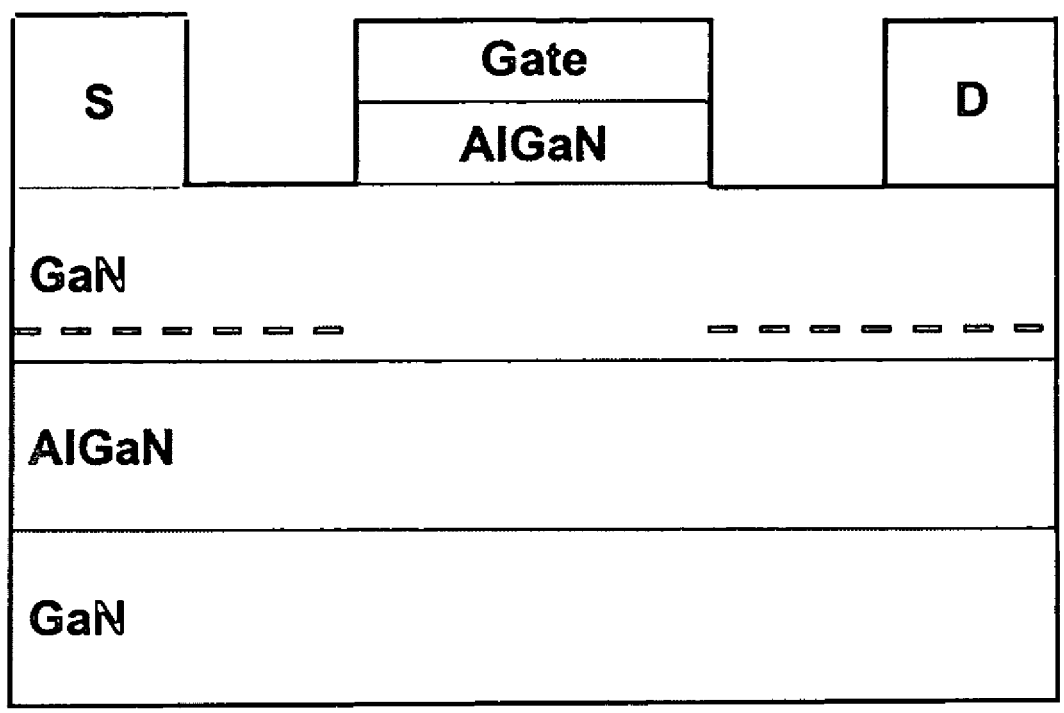
FIG. 1 is a cross-sectional schematic that discloses a novel enhancement mode HEMT transistor structure with a N-polar surface according to the preferred embodiment of the present invention.

FIG. 1 is a cross-sectional schematic that discloses a novel enhancement mode HEMT transistor structure with a N-polar surface according to the preferred embodiment of the present invention. This transistor includes a gate, source (S) and drain (D), where the transistor has an epilayer structure under the gate as follows: AlGaN(1)/GaN(1)/AlGaN(2)/GaN(2) (numbered from top to bottom layers). The AlGaN(1) layer is grown thick enough so that polarization fields in this layer deplete the 2DEG at the AlGaN(2)/GaN(1) interface under zero gate bias. Under the access and contact regions, the epilayer may include additional layers AlGaN(3)/GaN(3) (not shown), which are structured as follows: AlGaN(3)/GaN(3)/AlGaN(2)/GaN(2). In this case, the additional AlGaN(3) and GaN(3) layers are made thin enough to allow for a charge sheet (shown as the dashed lines) at the interface between the AlGaN (2) and GaN(3) layers, thus leading to low on resistance as well as low source and drain ohmic contact resistance. Since the gate depletes the channel under zero bias, while the conductive active regions allow for conduction at positive gate biases, this device can be used as a normally-off or enhancement mode FET for different applications. The idea of using polarization fields to reduce the electron population under the gate in the N-polar orientation is the basic principle behind this device.

Enhancement Mode N-Face HEMT

As noted above, enhancement mode or normally-off devices based on GaN technology are interesting for a variety of applications. In devices grown in the Ga-polar or (0001) direction, this is achieved by using an AlGaN/GaN buffer structure and etching away some of the AlGaN under the gate region until all the charge is depleted. This process therefore requires a gate recess etch, which increases gate leakage (since GaN can only be dry etched) and also leads to problems with threshold voltage non-uniformity and repeatability.

Figure 2:
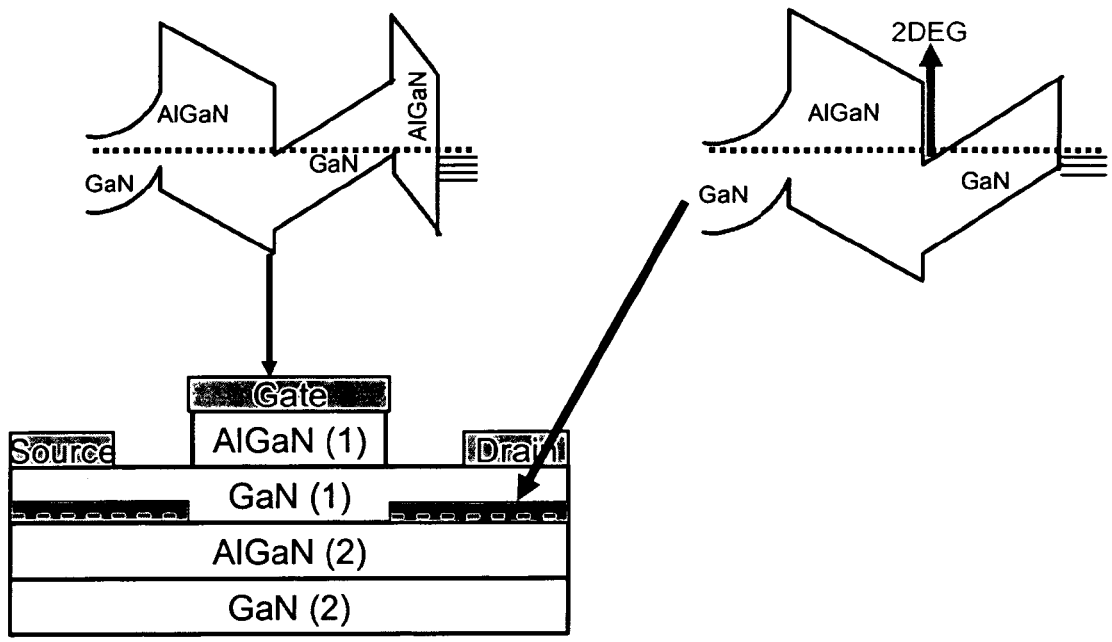
FIG. 2 is a band diagram of enhancement mode device, wherein the two-dimensional electron gas (2DEG) is depleted beneath the gate at zero bias.
Figure 3:
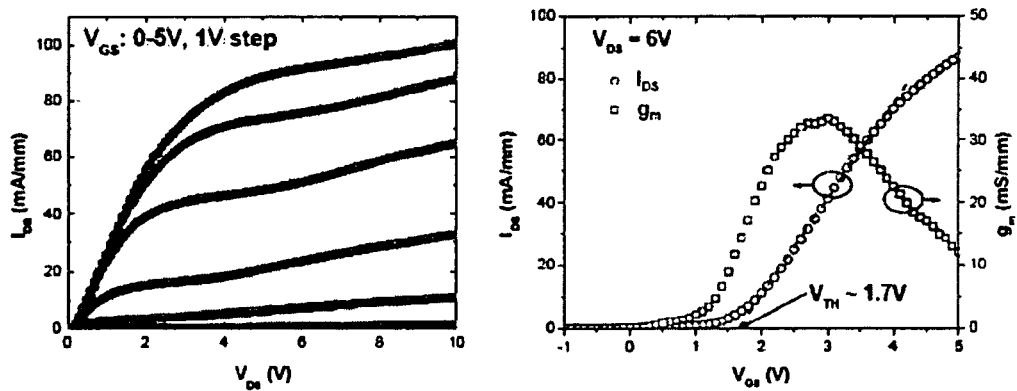
FIG. 3 includes two graphs that illustrate transfer characteristics of the first N-face enhancement mode device, wherein the threshold voltage is approximately 1.7V.

The present invention proposes a device structure in the opposite N-face or (000$\bar{1}$) orientation that does not have the drawbacks seen in the Ga-face device. The structure for this device is shown in FIG. 2, which includes a band diagram of an enhancement mode device wherein the 2DEG is depleted beneath the gate at zero bias. Under the gate, the epilayer stack is comprised of GaN(2) buffer/AlGaN(2)/GaN(1)/AlGaN(1) layers (numbered from bottom to top layers). The AlGaN(1) on the top (gate barrier layer) is grown thick enough so as to deplete any of the 2DEG induced at the bottom AlGaN(2)/GaN(1) interface. In the drain and access regions, this top AlGaN(1) is etched away leading to a high electron density in these regions. The 2DEG under the gate is induced when the gate is forward biased, while the charge in the access regions is always present. This is, therefore, a method to obtain enhancement mode devices without using a gate recess etch. Any variations in the etching of the access regions will only lead to changes in the on resistance which is not a critical parameter in circuit design. However, the threshold voltage in these devices is not affected by the processing. The transfer characteristics of the first demonstration of N-face enhancement-mode device are shown in FIG. 3, which includes two graphs showing the transfer characteristics of the first N-face enhancement mode device wherein the threshold voltage is approximately 1.7V.

Polarization fields in the N-face orientation can also be used to create enhancement mode devices using the same idea as described above, but with different heterostructure design. For example, the channel/gate barrier material can be any of and not restricted to the following: GaN/AlGaN, GaN/AlN, AlGaN (low Al composition)/AlGaN (high Al composition), InGaN/GaN, InGaN/AlGaN. The idea of using polarization fields to reduce the electron population under the gate in the N-polar orientation is the basic principle behind this device.

Dispersion Suppression in N-Face Transistors

As noted above, GaN devices have been shown to be promising for high frequency applications. Since unpassivated GaN HEMTs have been shown to be dispersive under high speed switching, it is important to engineer these devices to suppress dispersion and therefore optimize the device performance at microwave frequencies.

Figure 4A:
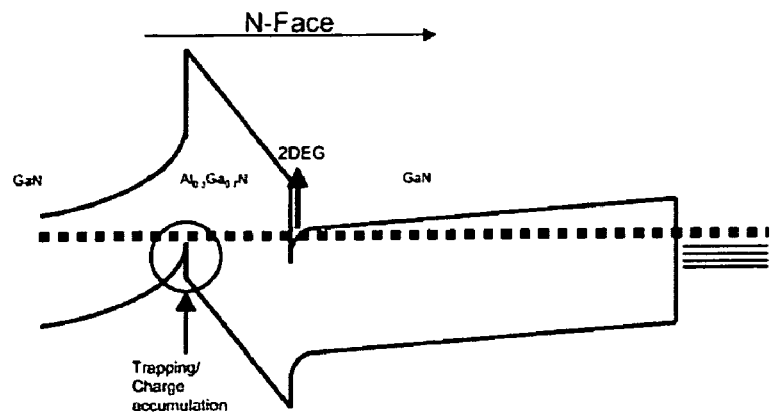
FIG. 4A is an N-face HEMT in equilibrium, wherein the gate is on the right side of the structure.
Figure 4B:
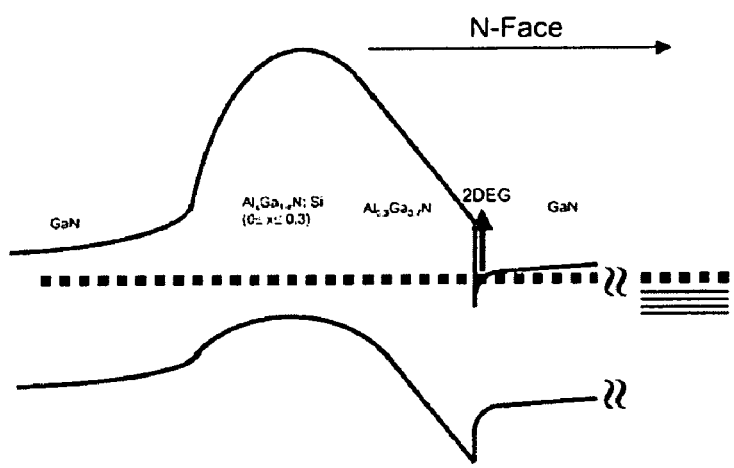
FIG. 4B shows the effect of grading the AlGaN to separate $E_f$ from $E_v$.
Figure 4C:
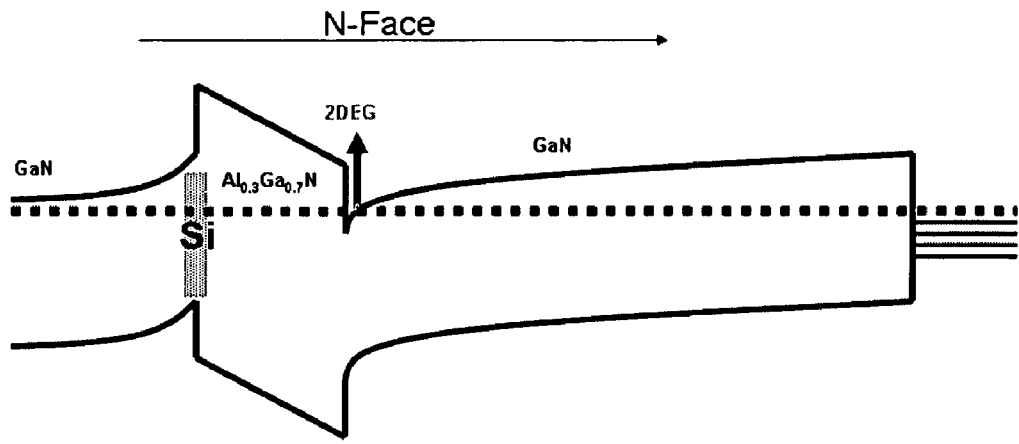
FIG. 4C shows the effect of adding a delta-doped n-type layer to prevent dispersion.

In Ga-face HEMTs, an important source of dispersion has been identified to be surface traps. A method of dispersion control at the epitaxial level is to employ a thick GaN cap layer on top of a standard AlGaN/GaN HEMT in order to increase the separation between surface traps and the 2DEG at the bottom AlGaN/GaN interface. FIG. 4A is an N-face HEMT in equilibrium, wherein the gate is on the right side of the structure; FIG. 4B shows the effect of grading the AlGaN to separate $E_f$ from $E_v$; and FIG. 4C shows the effect of adding a delta-doped n-type layer to prevent dispersion.

One drawback of the N-face capped structure is that the reverse polarization field in the GaN cap layer depletes electrons in the 2DEG. Also, the top AlGaN/GaN interface touches the valence band including a positive charge sheet that has been shown to cause trapping. This can be resolved using a graded AlGaN:Si cap. However, the use of AlGaN precludes the employment of AlGaN etch-stop layers that are very important technologically to repeatedly and reliably create these deep-recess devices.

It is proposed here that devices on N-face GaN can be designed to suppress dispersion in N-face FETs. FIG. 4A is an N-face HEMT that shows the equilibrium band diagram of such devices. The bottom AlGaN may be graded to prevent possible charge accumulation at the bottom GaN/AlGaN interface, as shown in FIG. 4B, wherein the effect of grading the AlGaN is to separate $E_f$ from $E_v$. The Si dopants provide charges for the channel. The top GaN layer does not deplete the 2DEG at the top AlGaN/GaN interface since there is no reverse polarization field as in Ga-face devices utilizing the same design principle. A thicker GaN layer results in higher 2DEG density since more screening of its polarization field is required to satisfy the surface boundary condition. It is therefore expected that N-face devices will have low dispersion while maintaining high charge density compared to similar Ga-face devices.

FIGS. 5A and 5B show a device grown in the Ga-face orientation, wherein the gate is on the left side of the structure.

The gate is deposited after a deep recess into the top GaN layer to obtain the desired separation between the gate metal and the 2DEG. A timed dry etch can be performed using a known calibrated etch rate with the potential disadvantages of fluctuations in etch depth and a rough etched surface. A more precise and smooth etch can be achieved by growing an AlGaN etch stop layer at the chosen location, as shown in FIG. 6, which shows the epitaxial structure of the N-face device for low dispersion. This AlGaN layer has an added advantage of reducing gate leakage as described in a separate disclosure on gate leakage reduction by N-face AlGaN barriers. Also, an enhancement mode thick GaN cap device may also be achieved on this wafer by varying the thickness of the AlGaN cap. Further, it may be possible to have devices with varying threshold voltages on the same wafer by varying the position of the AlGaN etch-stop layer.

Low Gate Leakage N-Face Transistors

Since GaN devices have been shown to be promising for high voltage high frequency applications, it is important to have devices with structures that reduce gate leakage and therefore increase the breakdown voltage of the device. The reduction in gate leakage will also increase the reliability of these devices.

FIGS. 5A and 5B show a device grown in the Ga-face orientation, wherein the gate is on the left side of the structure. The band diagram of an ordinary Ga-face HEMT is shown in FIG. 5A in equilibrium and in FIG. 5B in pinch-off conditions. The structure of this device is GaN buffer/AlGaN cap. As shown in FIG. 5B, the field in the AlGaN increases at pinch-off. This increases the probability of electron tunneling through the AlGaN barrier and therefore increases the gate leakage.

Figure 7A:
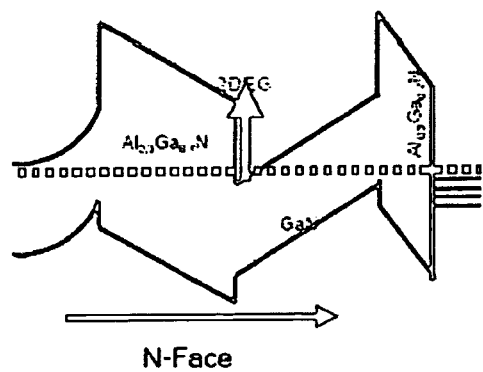
FIGS. 7A and 7B show the N-face orientation device in equilibrium and at pinch-off, wherein the gate is on the right-hand side.
Figure 7B:
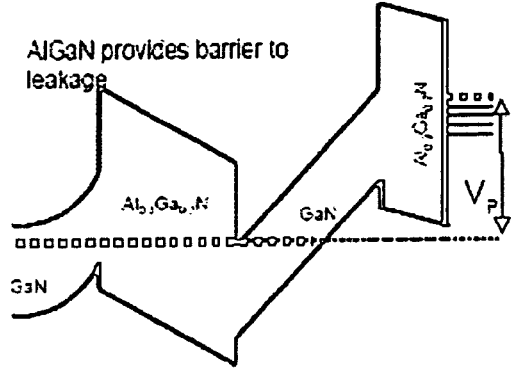

It is proposed here that devices on N-face GaN can be designed to reduce gate leakage and increase the breakdown voltage. FIG. 6 illustrates the general structure of the N-face device for low gate leakage, wherein the top AlGaN layer may be replaced by an AlN layer. The band diagram of an N-face orientation device is shown in FIG. 7A under equilibrium and in FIG. 7B under drain bias, wherein the gate is on the right-hand side. The structure of these devices is GaN buffer(2)/AlGaN(2)(graded or constant composition)/GaN(1)/AlGaN(1) (or AlN) cap.

The top AlGaN(1) (or AlN) cap is designed so that the electron channel at the bottom AlGaN(2)/GaN(1) interface is not depleted. There is a reverse polarization field in the AlGaN(1) layer that helps increase the effective barrier to electron tunneling from the gate. Further, the AlGaN has a higher Schottky barrier height and a higher breakdown field, both factors lead to a lower gate leakage and a higher breakdown voltage.

When this device is biased into pinch-off by applying a negative voltage on the surface (i.e., the gate), the electric fields in the AlGaN decrease, in contrast to the Ga-face case where there increase. This reduction of the electric fields makes the bands flat close to the gate, and therefore increases the effective barrier to electron tunneling. Thus, it is expected that these devices will have low gate leakage and high breakdown compared to similar Ga-face devices.

Gate Insulator

Figure 8:
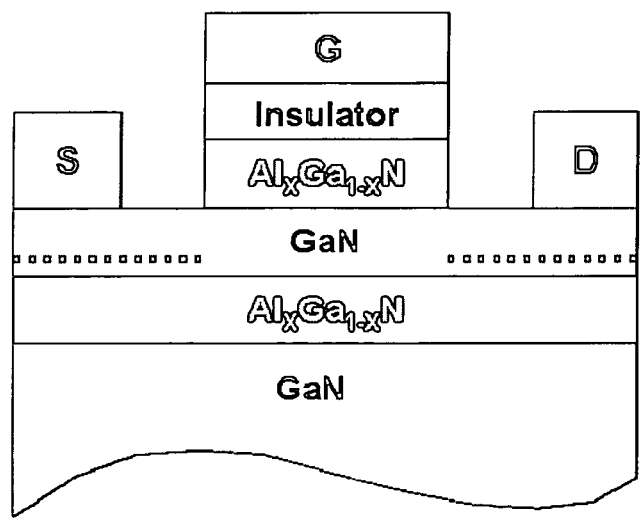

FIG. 8 also illustrates that an insulator may be inserted beneath the gate for reduction of gate leakage and improving gate turn-on. In this embodiment, the insulator may be any combination of $Si_xO_y$, $Si_xN_y$, $Al_xO_y$, and/or any other insulator. Typically, the insulator will have a thickness ranging from 0.1 Å to 5000 Å.

P-type Doping

Although p-type doping can be completely avoided in the proposed N-polar structure, p-type capping can also be incorporated to N-polar devices for reduction of gate leakage and increasing the gate turn-on voltage. In the Ga-polar direction, it is difficult to achieve high p-type doping concentrations due to localized domain inversion. However, in the N-polar direction, high p-type doping concentrations can be achieved without the occurrence of domain inversion.

Charge Confinement

Compared to the Ga-polar device, the 2DEG in the N-polar device is better confined. Better charge confinement in the N-polar device should reduce the threshold voltage dependence on drain bias.

Higher Turn-On

In the N-polar devices, the top AlGaN barrier can easily be modified for higher gate turn-on and higher transconductance. In Ga-polar devices, increasing the Al composition of the cap layer requires reducing the thickness of the cap layer but this reduction increases the threshold voltage non-uniformity. However, in the N-polar devices, the Al composition of the top AlGaN barrier can be increased (even up to AlN to increase the Schottky barrier height) without suffering from threshold voltage non-uniformity. As the Al composition of the barrier increases, the same threshold voltage can be maintained while decreasing the barrier thickness. Thus, higher transconductance can be achieved. Furthermore, under forward-bias, the effective barrier height of the N-polar devices is much higher than the Ga-polar devices. As a result of these two features, N-polar devices should have much higher gate turn-on than Ga-polar devices.

FIG. 9A and 9B illustrate N-polar and Ga-polar devices under forward bias, showing that an effective barrier exists in the N-polar face, leading to higher turn-on.

High Threshold Voltage

For power-switching applications, high threshold voltage (above +1 V) is necessary for gate signal noise immunity. In order to achieve high threshold voltage using method-1 and method-2, the thickness of the AlGaN barrier below the gate has to be extremely thin. However, as the AlGaN barrier becomes thin, gate turn-on voltage decreases rapidly. Thus, an increasingly thicker insulator below the gate is necessary as threshold voltage increases but this leads to reduction of transconductance. Although high threshold voltage can be achieved via method-3, p-GaN/AlGaN interface trap-related dispersion remains as a drawback. Since E-mode devices in the N-polar direction do not require thinning of the AlGaN barrier, devices can be designed to provide high threshold voltage (even +2 V) without sacrificing the gate turn-on voltage.

Alternative Embodiments

The materials could be grown on a set of different substrates such as SiC, sapphire, Si and oxides such as ZnO, lithium gallate and aluminate, etc.

The buffer used is, in general, of composition $Al(x)Ga(y)In(1-x-y)N$, where x and y can vary between 0 and 1. Furthermore, the composition can be varying through the thickness of the buffer while maintaining the enhancement-mode operation of the device. In addition, the buffer can be partly or completely doped by elements such as C, Fe, etc., to control the insulating nature of the buffer.

Although the above description refers to the use of AlGaN for the barrier layers, it is also possible to use an AlN cap (i.e., AL composition=1) to the same effect.

In addition, although the above description describes device epilayers grown on GaN, the same ideas could be used on AlGaN or AlN buffers. The relative numbers from the polarization would change, but the underlying design philosophy would still be valid.

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. An enhancement mode high electron mobility transistor (HEMT) device comprised of aluminum gallium nitride (AlGaN) and gallium nitride (GaN) layers with an N-polar surface, comprising:
   (a) an epilayer structure comprising an AlGaN (1) layer on a GaN (1) layer, the GaN (1) layer on an AlGaN (2) layer, and the AlGaN (2) layer on a GaN (2) layer, wherein the AlGaN (1) layer, the GaN (1) layer, the AlGaN (2) layer, and the GaN (2) layer are in an N-face or (000-1) orientation;
   (b) a first region directly above the GaN (1) layer including a source;
   (c) a second region directly above the GaN (1) layer including the AlGaN (1) layer and a gate on the AlGaN (1) layer;
   (d) a third region directly above the GaN (1) layer including a drain, wherein the drain and the source are formed on the GaN (1) layer on opposite sides of the AlGaN (1) layer;
   (e) a fourth region directly above the GaN (1) layer and between the AlGaN (1) layer; the source, wherein the fourth region does not include the AlGaN(1) layer;
   (f) a fifth region directly above the GaN (1) layer and between the AlGaN (1) layer; and the drain, wherein the fifth region does not include the AlGaN (1) layer; and
   (g) a two dimensional electron gas (2DEG) channel at an interface between the AlGaN(2) layer and the GaN(1) layer, wherein the AlGaN (1) layer is thick enough such that polarization fields in the AlGaN (1) layer deplete the 2DEG channel under the AlGaN(1) layer at zero bias applied to the gate;
   (h) so as to form the enhancement mode HEMT.

2. The device of claim 1, wherein the AlGaN (1) layer's thickness is between 0.1 nm and 10 μm.

3. The device of claim 1, wherein the AlGaN (2) and GaN (1) layers are made thin enough to allow for the 2DEG at the interface between the AlGaN (2) and the GaN (1) layers under the fourth region and under the fifth region.

4. The device of claim 1, wherein conductive active regions allow for conduction at positive gate biases.

5. The device of claim 1, wherein the AlGaN (1) layer is a p-type layer.

6. The device of claim 1, wherein the device has a threshold voltage above 1 V.

7. The device of claim 6, wherein the device has a threshold voltage of approximately 1.7 V.

8. The device of claim 6, wherein the device has a threshold voltage above 2 V.

9. The device of claim 1, wherein the AlGaN (1) layer comprises AlN.

10. The device of claim 1, wherein an Al composition of the AlGaN (2) layer is graded to form a grade.

11. The device of claim 10, wherein the grade prevents charge accumulation at an interface of the AlGaN (2) and GaN (2) layers.

12. The device of claim 10, wherein the grade of the AlGaN (2) layer causes a separation between a Fermi level and a valence band in the AlGaN (2) layer.

13. The device of claim 1, wherein the GaN (2) layer is doped n-type.

14. The device of claim 13, wherein the GaN (2) layer is doped with Silicon dopants.

15. The device of claim 13, wherein the GaN (2) layer is delta-doped n-type.

16. The device of claim 1, wherein the AlGaN (2) layer is doped n-type.

17. The device of claim 16, wherein n-type dopants in the AlGaN (2) layer are Silicon dopants.

18. The device of claim 1, further comprising an insulator between the gate and the AlGaN (1) layer.

19. A method of fabricating an enhancement mode high electron mobility transistor (HEMT) structure comprised of aluminum gallium nitride (AlGaN) and gallium nitride (GaN) layers with an N-polar surface, comprising:
   forming an epilayer stack comprised of a GaN (2) buffer layer, an AlGaN (2) layer on the GaN (2) buffer layer, a GaN (1) layer on the AlGaN (2) layer, and an AlGaN (1) layer on the GaN (1) layer, wherein the AlGaN (1) layer, the GaN (1) layer, the AlGaN (2) layer, and the GaN (2) layer are in and N-face or (000-1) orientation;
   forming a gate on the AlGaN (1) layer
   forming a source and a drain on the GaN(1) layer on opposite sides of the AlGaN (1) layer; wherein:
   (a) a first region directly above the GaN (1) layer includes the source;
   (b) a second region directly above the GaN (1) layer includes the AlGaN (1) layer and the gate on the AlGaN (1) layer;
   (c) a third region directly above the GaN (1) layer includes the drain;
   (d) a fourth region directly above the GaN (1) layer, and between the AlGaN (1) layer and the source, does not include the AlGaN (1) layer;
   (e) a fifth region directly above the GaN (1) layer, and between the AlGaN (1) layer; and the drain, does not include the AlGaN (1) layer; and
   (f) a two dimensional electron gas (2DEG) channel is formed at an interface between the AlGaN(2) layer and the GaN(1) layer and the AlGaN (1) layer is thick enough such that polarization fields in the AlGaN (1) layer deplete the 2DEG channel under the AlGaN(1) layer at zero bias applied to the gate;
   so that the enhancement mode HEMT is made.

20. The method of claim 19, wherein the AlGaN (1) layer thickness is between 0.1 nm and 10 μm.

21. The method of claim 19, wherein the GaN (2) buffer layer comprises any composition of AlInGaN.

22. The method of claim 19, wherein the AlGaN (2) layer comprises any composition of AlInGaN.

23. The method of claim 19, wherein the GaN (1) layer comprises any composition of AlGaInN.

24. The method of claim 19, wherein the AlGaN (1) layer comprises any composition of AlInGaN.

25. The method of claim 19, wherein n-type dopants are incorporated in the GaN (1) layer to induce mobile electronic charge.

26. The method of claim 19, wherein surface modifications involving plasma treatment, implantation, and deposition are carried out in the regions under the fourth region and under the fifth region to induce mobile electronic charge.

27. The method of claim 19, wherein the AlGaN (1) layer is a p-type layer.

28. The method of claim 19, wherein the AlGaN (1) layer comprises AlN.

29. The method of claim 19, wherein an Al composition of the AlGaN (2) layer is graded to form a grade.

30. The method of claim 19, wherein the GaN (2) layer is doped n-type.

31. The method of claim 30, wherein the GaN (2) layer is doped with Silicon dopants.

32. The method of claim 30, wherein the GaN (2) layer is delta-doped n-type.

33. The method of claim 19, wherein the AlGaN (2) layer is doped n-type.

34. The method of claim 33, wherein n-type dopants in the AlGaN (2) layer are Silicon dopants.

35. The method of claim 19, further comprising forming an insulator between the gate and the AlGaN (1) layer.

36. The method of claim 19, wherein the AlGaN(2) and GaN(1) layers are made thin enough to allow for a charge sheet at an interface between the AlGaN (2) and GaN (1) layers under the fourth region and under the fifth region.

37. The method of claim 19, wherein an electron gas under the gate is depleted at zero gate bias, while conductive active regions allow for conduction at positive gate biases.

* * * * *